United States Patent
Kijima et al.

(10) Patent No.: US 9,832,724 B2
(45) Date of Patent: Nov. 28, 2017

(54) RADIO COMMUNICATION DEVICE AND RADIO COMMUNICATION METHOD

(71) Applicant: Renesas Electronics Corporation, Tokyo (JP)

(72) Inventors: Kazuhiro Kijima, Tokyo (JP); Wataru Naito, Tokyo (JP)

(73) Assignee: RENESAS ELCTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/232,152

(22) Filed: Aug. 9, 2016

(65) Prior Publication Data

US 2017/0094596 A1 Mar. 30, 2017

(30) Foreign Application Priority Data

Sep. 25, 2015 (JP) .................................. 2015-188002

(51) Int. Cl.
| | |
|---|---|
| *H04B 1/18* | (2006.01) |
| *H04W 52/02* | (2009.01) |
| *H03L 7/185* | (2006.01) |
| *H04B 1/16* | (2006.01) |

(52) U.S. Cl.
CPC ......... *H04W 52/0209* (2013.01); *H03L 7/185* (2013.01); *H04B 1/16* (2013.01)

(58) Field of Classification Search
CPC . H04B 1/10; H04B 1/16; H04B 15/00; H04B 15/005; H04B 15/02; H04W 52/0209; H03L 7/185
See application file for complete search history.

(56) References Cited

U.S. PATENT DOCUMENTS

| 8,294,445 | B2 | 10/2012 | Kwok | |
|---|---|---|---|---|
| 2006/0072350 | A1* | 4/2006 | Mitrosky | H02M 1/12 363/39 |
| 2010/0141233 | A1* | 6/2010 | Kwok | H02M 1/44 323/351 |
| 2013/0336368 | A1* | 12/2013 | Arima | H04B 1/7097 375/144 |
| 2016/0233869 | A1* | 8/2016 | Khoury | H04B 1/10 |

FOREIGN PATENT DOCUMENTS

| JP | 2010-207013 A | 9/2010 |
|---|---|---|
| JP | 2014-060921 A | 4/2014 |

* cited by examiner

*Primary Examiner* — Nguyen Vo
(74) *Attorney, Agent, or Firm* — Mattingly & Malur, PC

(57) ABSTRACT

According to one embodiment, a radio communication device 1 includes a variable frequency divider 17 that divides a frequency of a reference clock REFCLK and outputs a frequency divided clock DCLK; a controller 15 that controls a frequency dividing ratio of the variable frequency divider 17 so that an integral multiple of a frequency of the frequency divided clock DCLK is not included in a frequency band of a high-frequency signal that has been received from outside by radio; and a DCDC converter 18 that performs a switching operation in synchronization with the frequency divided clock DCLK to generate an output voltage Vout obtained by stepping down an input voltage Vin.

10 Claims, 5 Drawing Sheets

RADIO COMMUNICATION DEVICE AND RADIO COMMUNICATION METHOD

CROSS-REFERENCE TO RELATED APPLICATIONS

This application is based upon and claims the benefit of priority from Japanese patent application No. 2015-188002, filed on Sep. 25, 2015, the disclosure of which is incorporated herein in its entirety by reference.

BACKGROUND

The present invention relates to a radio communication device and a radio communication method, and relates to a radio communication device and a radio communication method capable of suppressing an increase in power consumption without causing the reception sensitivity to be degraded.

The radio communication device demodulates a high-frequency signal that has been received by radio from outside via an antenna into a baseband signal and executes a predetermined processing, or modulates a baseband signal into a high-frequency signal and transmits the high-frequency signal to the outside by radio via an antenna.

The radio communication device includes a voltage generator that generates a voltage to be supplied to respective functional blocks. The radio communication device on which the voltage generator is mounted is disclosed, for example, in Japanese Unexamined Patent Application Publication No. 2010-207013 and Japanese Unexamined Patent Application Publication No. 2014-60921.

SUMMARY

In the configuration disclosed in Japanese Unexamined Patent Application Publication No. 2010-207013, a Low Drop Out (LDO) regulator is used as the voltage generator. However, in the LDO regulator, current constantly flows and it is thus impossible to sufficiently reduce power consumption. The other problems of the related art and the novel characteristics of the present invention will be made apparent from the descriptions of the specification and the accompanying drawings.

According to one embodiment, a radio communication device includes: a variable frequency divider that divides a frequency of a reference clock and outputs a frequency divided clock; a controller that controls a frequency dividing ratio of the variable frequency divider so that an integral multiple of a frequency of the frequency divided clock is not included in a frequency band of the high-frequency signal that has been received from outside by radio; and a DCDC converter that performs a switching operation in synchronization with the frequency divided clock to generate an output voltage obtained by stepping down an input voltage.

According to another embodiment, a radio communication method includes: receiving a high-frequency signal by radio from outside via an antenna; controlling a frequency dividing ratio of a variable frequency divider so that an integral multiple of a frequency of a frequency divided clock output from the variable frequency divider based on a reference clock is not included in a frequency band of the high-frequency signal; and performing a switching operation in synchronization with the frequency divided clock to output an output voltage obtained by stepping down an input voltage from a DCDC converter.

According to the embodiment, it is possible to provide a radio communication device and a radio communication method capable of suppressing an increase in power consumption without causing the reception sensitivity to be degraded.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
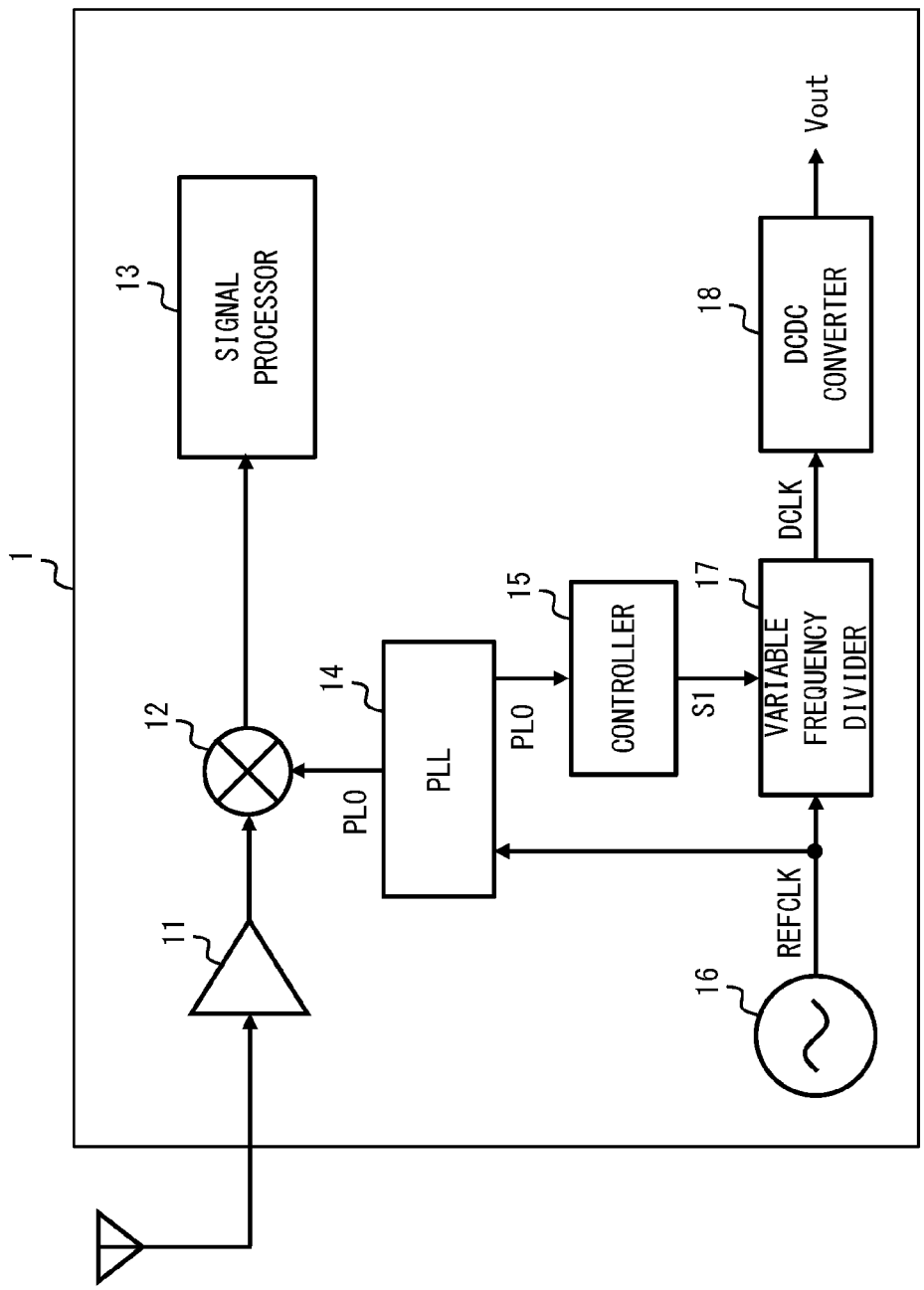
FIG. 1 is a block diagram showing a configuration example of a radio communication device according to a first embodiment.

Embodiments of the present invention will be described below with reference to the accompanying drawings. Note that the drawings are in simplified form, and the technical scope of the embodiments should not be interpreted to be limited to the drawings. The same elements are denoted by the same reference numerals, and a duplicate description is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<Previous Studies by the Inventors>

Before describing the details of a radio communication device according to a first embodiment, a radio communication device 50 that has been previously studied by the present inventors will be described first with reference to FIG. 5.

Figure 5:
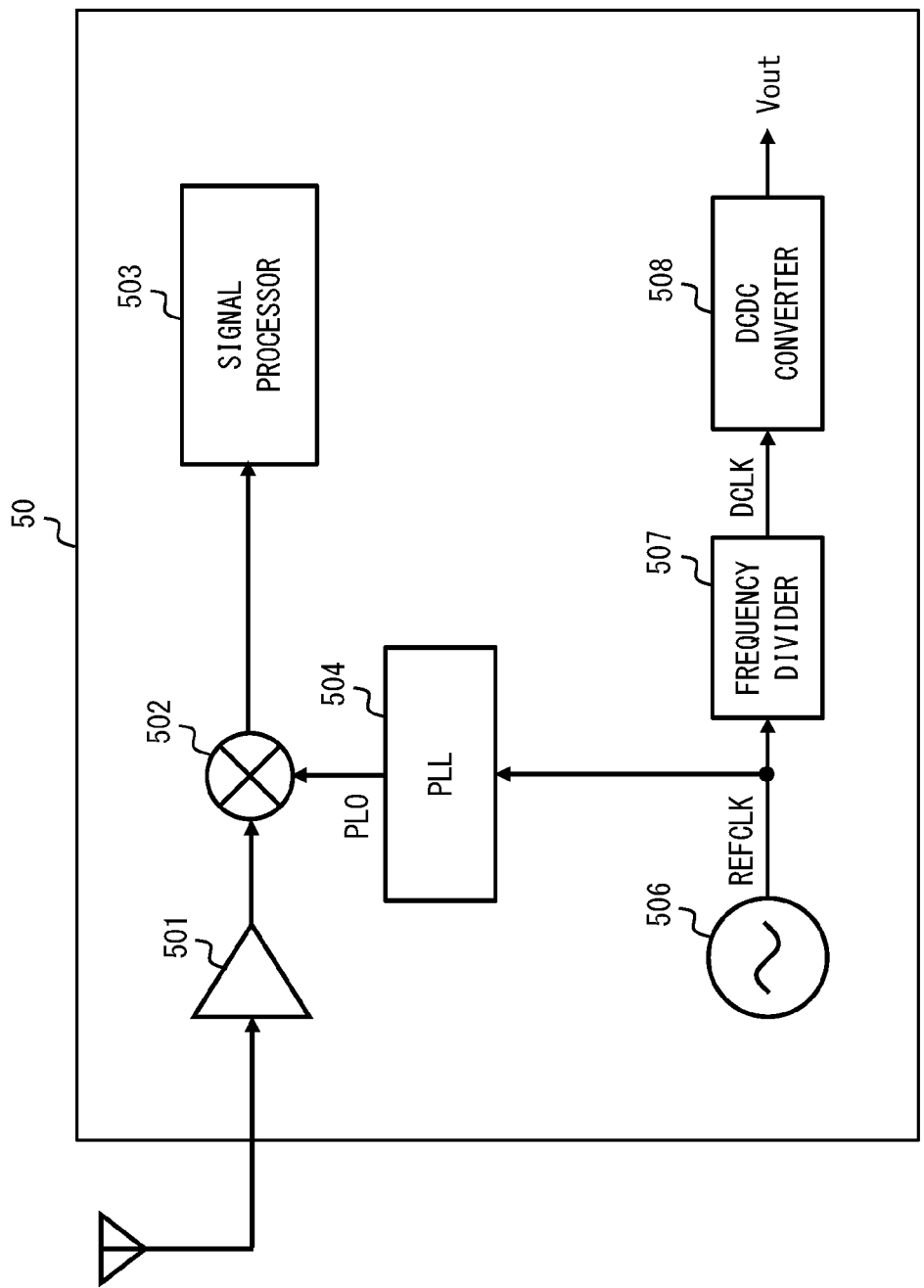
FIG. 5 is a block diagram showing a configuration example of a radio communication device according to the idea before the embodiment has been devised.

FIG. 5 is a block diagram showing a configuration example of the radio communication device 50 according to the idea before the embodiment has been devised. The radio communication device 50 is applied, for example, to a smart meter, a mobile telephone, a car navigation system or the like.

As shown in FIG. 5, the radio communication device 50 at least includes a low-noise amplifier 501, a mixer (frequency converter) 502, a signal processor 503, a PLL circuit 504, a reference clock generator 506, a frequency divider 507, and a DCDC converter 508. The reference clock generator 506, the frequency divider 507, and the DCDC converter 508 form a voltage generator. Further, the low-noise amplifier 501 and the mixer 502 form a radio reception unit.

The low-noise amplifier 501 amplifies a high-frequency signal that has been received by radio from outside via an antenna with low noise. In this example, a case in which the frequency band of a reception channel is 923.8 MHz to 924.2 MHz (that is, the center frequency is 924 MHz and the bandwidth is 400 KHz) will be described.

The PLL circuit 504 generates a carrier wave signal PLO based on a reference clock REFCLK generated by the reference clock generator 506. In this example, the PLL circuit 504 generates the carrier wave signal PLO from the reference clock REFCLK of 48 MHz in accordance with the center frequency of the reception channel.

The mixer 502 performs a frequency conversion of the high-frequency signal amplified by the low-noise amplifier 501 based on the carrier wave signal PLO generated by the PLL circuit 504. In this example, the mixer 502 multiplies the carrier wave signal PLO by the amplified high-frequency signal to thereby demodulate the amplified high-frequency signal into a baseband signal.

The signal processor 503 is, for example, a baseband processor and executes a predetermined processing based on the baseband signal output from the mixer 502.

The frequency divider 507 divides the frequency of the reference clock REFCLK by a predetermined frequency dividing ratio and outputs a frequency divided clock DCLK. In this example, the frequency divider 507 divides the frequency of the reference clock REFCLK of 48 MHz by the frequency dividing ratio 12 to thereby output the frequency divided clock DCLK of 4 MHz.

The DCDC converter 508 includes a circuit configuration employing a switching system and performs a switching operation in synchronization with the frequency divided clock DCLK to thereby generate an output voltage Vout obtained by stepping down an input voltage Vin supplied from a power supply (not shown). The output voltage Vout is supplied to the respective blocks provided in the radio communication device 50 (e.g., the low-noise amplifier 501, the mixer 502, the signal processor 503, the PLL circuit 504, the reference clock generator 506, and the frequency divider 507).

As stated above, the radio communication device 50 is able to intermittently flow current from the power supply to the DCDC converter 508 by using the DCDC converter 508 without using the LDO regulator, whereby it is possible to suppress the increase in the power consumption.

However, in the configuration of the radio communication device 50, harmonic components occurring due to the switching operation of the DCDC converter 508 may propagate, for example, to the side of the radio reception unit via a common ground voltage terminal GND and interrupt the radio reception of the high-frequency signal. As a result, the reception sensitivity of the radio communication device 50 may be degraded. When the radio communication device 50 is applied to a smart meter in which the restrictions of the reception sensitivity are severe, in particular, this problem becomes more serious.

Specifically, harmonic components of 924 MHz, which corresponds to 231 times larger than the frequency divided clock DCLK of 4 MHz used for the switching operation of the DCDC converter 508 may propagate to the side of the radio reception unit and interrupt the radio reception of the high-frequency signal whose frequency band is 923.8 MHz to 924.2 MHz. This causes the reception sensitivity of the radio communication device 50 to be degraded.

A radio communication device 1 according to a first embodiment has thus invented so that it becomes possible to suppress the increase in the power consumption without causing the reception sensitivity to be degraded.

First Embodiment

FIG. 1 is a block diagram showing a configuration example of a radio communication device 1 according to a first embodiment. The radio communication device 1 is applied, for example, to a smart meter, a mobile telephone, or a car navigation system.

As shown in FIG. 1, the radio communication device 1 at least includes a low-noise amplifier 11, a mixer 12, a signal processor 13, a PLL circuit 14, a controller 15, a reference clock generator 16, a variable frequency divider 17, and a DCDC converter 18. The controller 15, the reference clock generator 16, the variable frequency divider 17, and the DCDC converter 18 form a voltage generator. Further, the low-noise amplifier 11 and the mixer 12 form a radio reception unit.

The low-noise amplifier 11 amplifies a high-frequency signal that has been received by radio from outside via an antenna with low noise. The low-noise amplifier 11 may be omitted unless it is required to amplify the high-frequency signal. In this embodiment, a case in which the frequency band of a reception channel is 923.8 MHz to 924.2 MHz (that is, the center frequency is 924 MHz and the bandwidth is 400 KHz) will be described.

The PLL circuit 14 generates a carrier wave signal PLO based on a reference clock REFCLK generated by the reference clock generator 16. In this embodiment, an example in which the PLL circuit 14 generates the carrier wave signal PLO from the reference clock REFCLK of 48 MHz in accordance with the center frequency of the reception channel will be described as an example.

The mixer 12 performs a frequency conversion of the high-frequency signal amplified by the low-noise amplifier 11 based on the carrier wave signal PLO generated by the PLL circuit 14. In this embodiment, an example in which the mixer 12 multiplies the carrier wave signal PLO by the amplified high-frequency signal to thereby demodulate the amplified high-frequency signal into a baseband signal will be described as an example.

The signal processor 13 is, for example, a baseband processor and executes a predetermined processing based on the baseband signal output from the mixer 12.

The controller 15 outputs a control signal S1 in accordance with the frequency band of the high-frequency signal that has been received by radio. Further, the controller 15 acquires, for example, information on the frequency band (frequency band of the reception channel) of the high-frequency signal that has been received by radio from the frequency of the carrier wave signal PLO of the PLL circuit 14.

The variable frequency divider 17 divides the frequency of the reference clock REFCLK by a frequency dividing ratio in accordance with the control signal S1 and outputs a frequency divided clock DCLK.

The DCDC converter 18 includes a circuit configuration employing a switching system. The DCDC converter 18 performs the switching operation in synchronization with the frequency divided clock DCLK to thereby generate an output voltage Vout obtained by stepping down an input voltage Vin supplied from a power supply (not shown). The output voltage Vout is supplied to the respective functional blocks provided in the radio communication device 1 (e.g., the low-noise amplifier 11, the mixer 12, the signal processor 13, the PLL circuit 14, the controller 15, the reference clock generator 16, and the variable frequency divider 17).

(Configuration Example of DCDC Converter 18)

Figure 2:
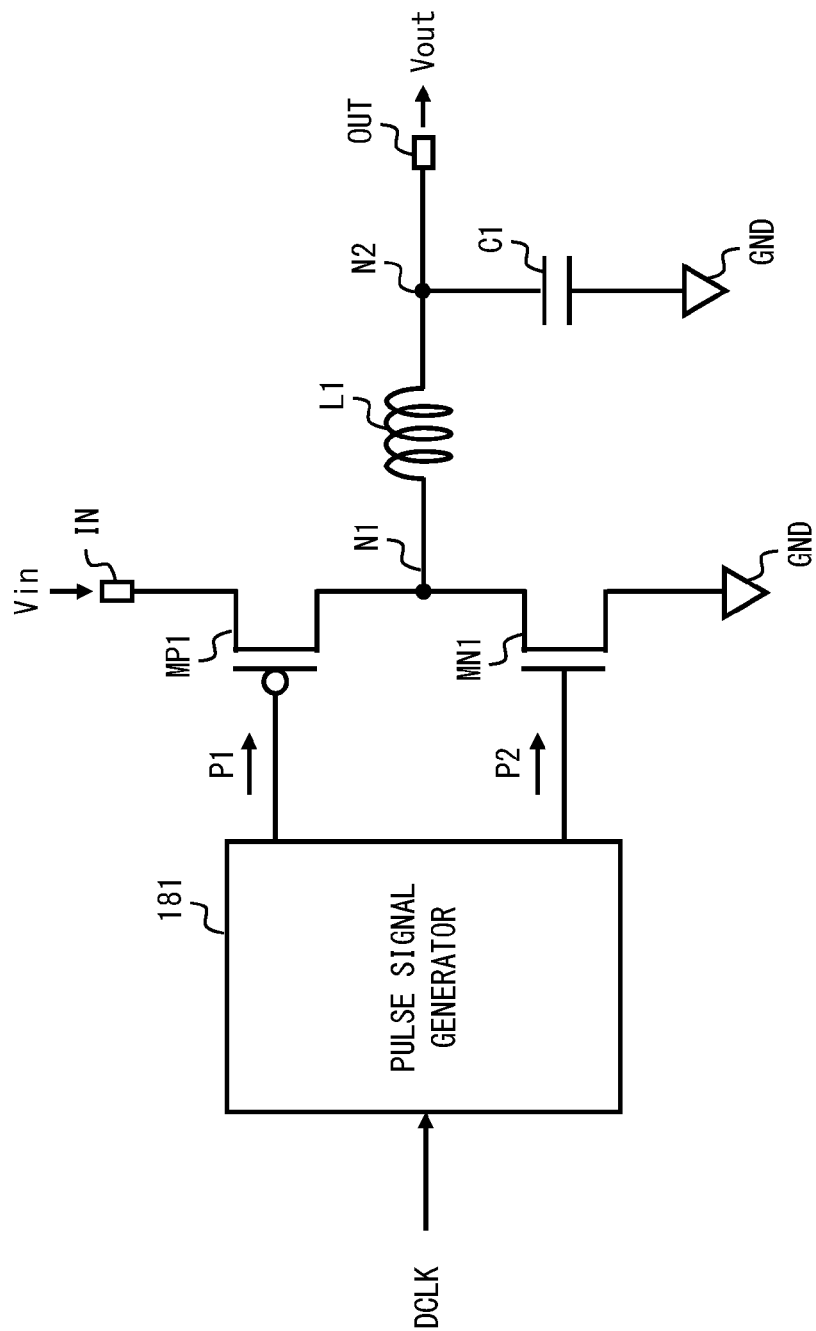
FIG. 2 is a diagram showing one example of a specific configuration of a DCDC converter provided in the radio communication device shown in FIG. 1.

FIG. 2 is a diagram showing one example of a specific configuration of the DCDC converter 18.

As shown in FIG. 2, the DCDC converter 18 includes a pulse signal generator 181, a P-channel MOS transistor (hereinafter it will be simply referred to as a transistor) MP1, an N-channel MOS transistor (hereinafter it will be simply referred to as a transistor) MN1, an inductor L1, and a capacitor C1.

The pulse signal generator 181 outputs pulse signals P1 and P2 having the period and the pulse width in accordance with the frequency of the frequency divided clock DCLK output from the variable frequency divider 17 and the ratio of the output voltage Vout to the input voltage Vin. The pulse signals P1 and P2 change in a similar way.

For example, the periods of the pulse signals P1 and P2 decrease as the frequency of the frequency divided clock DCLK increases and increase as the frequency of the frequency divided clock DCLK decreases. Further, the pulse widths of the pulse signals P1 and P2 become narrow when the ratio of the output voltage Vout to the input voltage Vin is too small (ON period of the transistor MP1 increases) and become wide when the ratio of the output voltage Vout to the input voltage Vin is too large (ON period of the transistor MP1 decreases). The output voltage Vout is therefore kept to a desired level.

The transistor MP1 has a source that is connected to an input terminal IN, a drain that is connected to one end (node N1) of the inductor L1, and a gate to which the pulse signal P1 from the pulse signal generator 181 is supplied. The transistor MN1 has a source that is connected to a ground voltage terminal GND, a drain that is connected to the node N1, and a gate to which the pulse signal P2 from the pulse signal generator 181 is supplied. The input terminal IN receives the input voltage Vin from the power supply (not shown). The ground voltage terminal GND is supplied with a ground voltage GND. The other end (node N2) of the inductor L1 is connected to the output terminal OUT. The capacitor C1 is provided between an output terminal OUT and the ground voltage terminal GND.

Next, a basic operation of the DCDC converter 18 will be described.

First, when the transistor MP1 is turned on and the transistor MN1 is turned off, current flows from the input terminal IN to the output terminal OUT via the transistor MP1 and the inductor L1. At this time, current energy is stored in the inductor L1.

After that, the transistor MP1 is turned off and the transistor MN1 is turned on, whereby the current that has flowed from the input terminal IN to the inductor L1 via the transistor MP1 is interrupted. The inductor L1 releases the stored current energy toward the output terminal OUT, trying to keep the value of the current that has just flowed therethrough. Accordingly, the current flows from the ground voltage terminal GND to the output terminal OUT via the transistor MN1.

By repeating the above operations, the DCDC converter 18 generates the output voltage Vout obtained by stepping down the input voltage Vin by the amount corresponding to the voltage according to the duty ratio of the pulse signals P1 and P2.

As stated above, the radio communication device 1 is able to intermittently flow the current from the power supply to the DCDC converter 18 by using the DCDC converter 18 without using the LDO regulator, whereby it is possible to suppress the increase in the power consumption.

Figure 3:
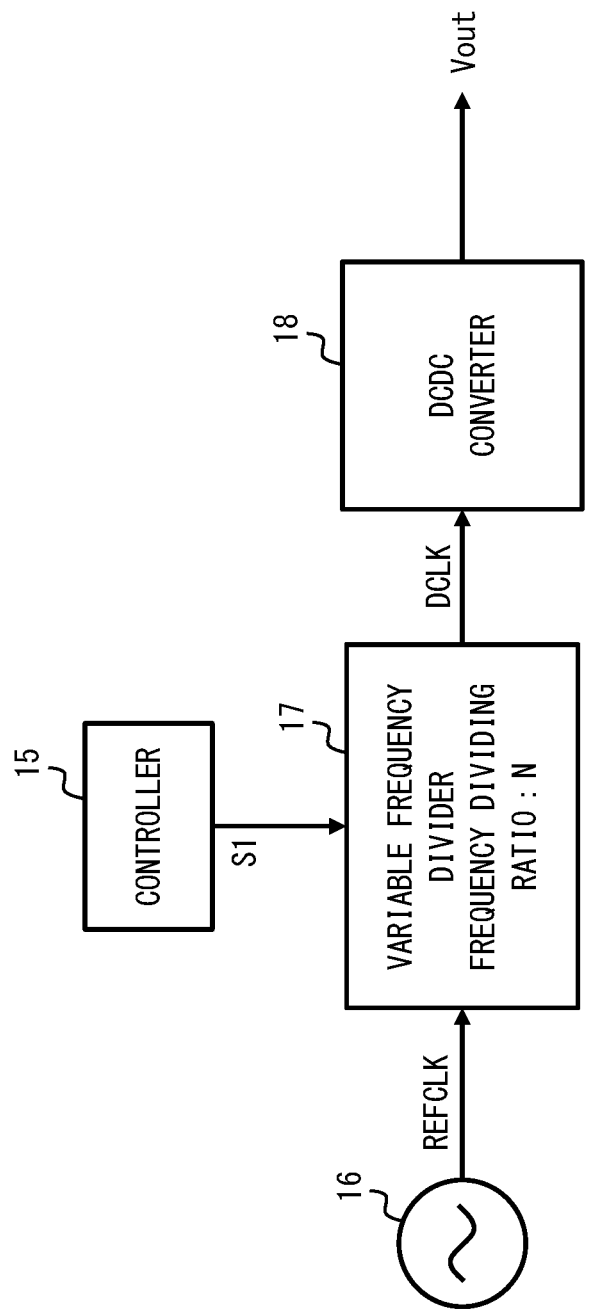
FIG. 3 is a block diagram showing a voltage generator provided in the radio communication device shown in FIG. 1.

FIG. 3 is a block diagram showing a voltage generator provided in the radio communication device 1.

As shown in FIG. 3, the variable frequency divider 17 divides the frequency of the reference clock REFCLK by a frequency dividing ratio N (N is an arbitrary natural number) according to the control signal S1 and outputs the frequency divided clock DCLK. The variable frequency divider 17 is configured to be able to divide, for example, the reference clock REFCLK by the frequency dividing ratio N=12, N=13 or the like and output the frequency divided clock DCLK.

The controller 15 controls the frequency dividing ratio N of the variable frequency divider 17 so that the integral multiple of the frequency of the frequency divided clock DCLK input to the DCDC converter 18 is not included in the frequency band of the high-frequency signal that has been received by radio.

When the frequency dividing ratio N is 12, for example, the variable frequency divider 17 divides the frequency of the reference clock REFCLK of 48 MHz and outputs the frequency divided clock DCLK of 4 MHz. In this case, the integral multiple 924 MHz (=4 MHz×231) of the frequency of the frequency divided clock DCLK falls within the frequency band 923.8 MHz to 924.2 MHz of the high-frequency signal that has been received by radio. Therefore, high-frequency components of 924 MHz of the frequency divided clock DCLK input to the DCDC converter 18 may propagate to the side of the radio reception unit and interrupt the radio reception of the high-frequency signal of the frequency band of 923.8 MHz to 924.2 MHz. As a result, the reception sensitivity of the radio communication device 1 is degraded.

On the other hand, when the frequency dividing ratio N is 13, the variable frequency divider 17 divides the frequency of the reference clock REFCLK of 48 MHz and outputs the frequency divided clock DCLK of about 3.7 MHz. In this case, the integral multiple of the frequency of the frequency divided clock DCLK (e.g., 921.3 MHz (=3.7 MHz×249) or 925 MHz (=3.7 MHz×250)) does not fall within the frequency band 923.8 MHz to 924.2 MHz of the high-frequency signal that has been received by radio. Therefore, the high-frequency components of the frequency divided clock DCLK input to the DCDC converter 18 do not propagate to the side of the radio reception unit and interrupt the radio reception of the high-frequency signal. That is, the reception sensitivity of the radio communication device 1 is not degraded.

Therefore, the controller 15 controls the frequency dividing ratio N of the variable frequency divider 17 to 13. The radio communication device 1 is therefore able to suppress the degradation of the reception sensitivity.

As described above, the radio communication device 1 according to this embodiment includes the DCDC converter 18 as the voltage generator to thereby suppress the increase in the power consumption. The radio communication device 1 according to this embodiment controls the frequency dividing ratio N of the variable frequency divider 17 so that the integral multiple (high-frequency components) of the frequency of the frequency divided clock DCLK used for the switching operation of the DCDC converter 18 is not included in the frequency band of the reception channel. The radio communication device 1 according to this embodiment is therefore able to suppress the increase in the power consumption without causing the reception sensitivity to be degraded.

This is particularly effective when the radio communication device 1 is applied to a smart meter or the like in which the restrictions of the reception sensitivity are severe and a large variety of reception channels are used.

While the case in which the variable frequency divider 17 is able to selectively set one of the two frequency dividing ratios N=12 and 13 has been described as an example in this embodiment, the present invention is not limited to this case. The variable frequency divider 17 may change the above configuration to a configuration in which it is possible to selectively set one of three or more frequency dividing ratios N (e.g., N=11, 12, 13) as appropriate. This allows an increase in the choices of the frequency dividing ratio N, whereby it is possible to prevent the occurrence of interfering waves more accurately. Further, even when the frequency band of the reception channel becomes wider, the occurrence of the interfering waves can be suppressed.

Other functional blocks that are required for the radio communication may further be provided in the radio communication device 1. For example, a band-pass filter that allows only a desired frequency bandwidth among the high-frequency signals that have been received by radio from outside via an antenna to pass may further be provided.

(Difference Between Radio Communication Device Disclosed in Japanese Unexamined Patent Application Publication No. 2014-60921 and Radio Communication Device According to Embodiment)

The configuration disclosed in Japanese Unexamined Patent Application Publication No. 2014-60921 merely controls the frequency of the clock used for the switching operation of the DCDC converter to become larger than the half of the bandwidth of the RF channel. That is, Japanese Unexamined Patent Application Publication No. 2014-60921 neither discloses nor suggests the configuration that controls the frequency of the clock so that the integral multiple of the frequency of the clock used for the switching operation of the DCDC converter is not included in the frequency band of the RF channel (reception channel). Therefore, in the configuration disclosed in Japanese Unexamined Patent Application Publication No. 2014-60921, the high-frequency components of the clock interrupt the high-frequency signal, which causes the reception sensitivity to be degraded. On the other hand, such a problem does not occur in the radio communication device 1 according to this embodiment.

Second Embodiment

Figure 4:
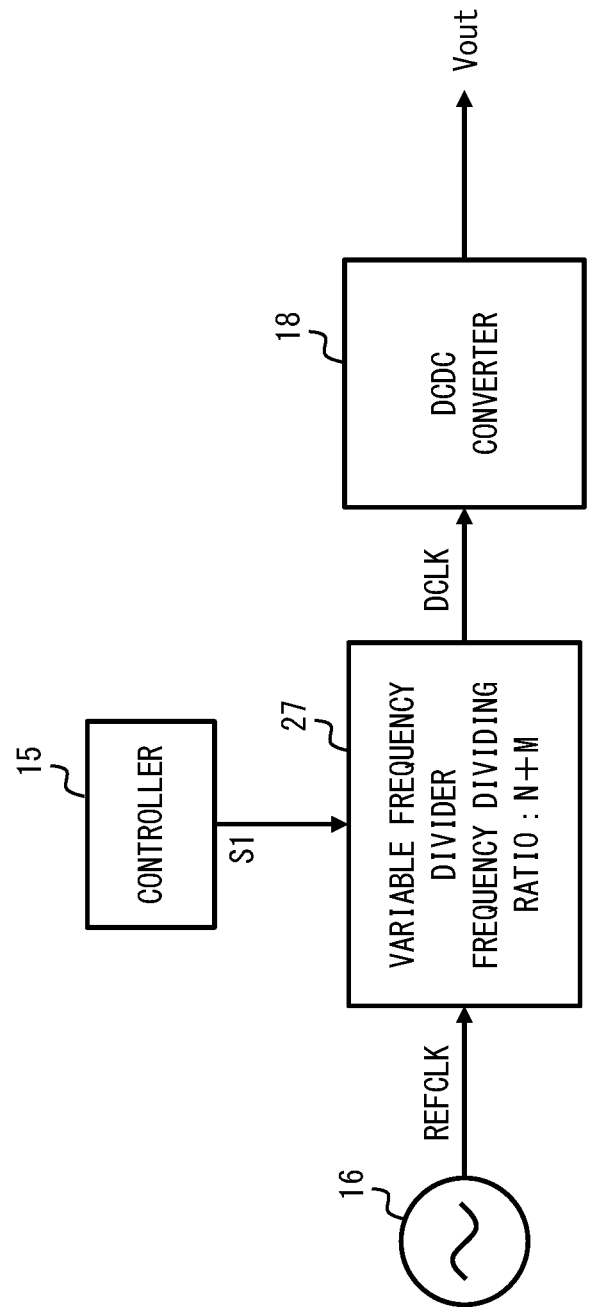
FIG. 4 is a block diagram showing a voltage generator provided in a radio communication device according to a second embodiment.

FIG. 4 is a block diagram showing a voltage generator provided in a radio communication device 2 according to a second embodiment. The radio communication device 2 includes, in place of the variable frequency divider 17, a variable frequency divider 27.

As shown in FIG. 4, the variable frequency divider 27 divides the reference clock REFCLK by the frequency dividing ratio "N (N is an arbitrary natural number)+M (M is an arbitrary fraction)" according to the control signal S1 and outputs the frequency divided clock DCLK. For example, the variable frequency divider 27 is configured to be able to divide the frequency of the reference clock REFCLK by the frequency dividing ratio "N+M"=12+1/3≈12.33 or the like and output the frequency divided clock DCLK.

The controller 15 controls the frequency dividing ratio "N+M" of the variable frequency divider 27 so that the integral multiple of the frequency of the frequency divided clock DCLK input to the DCDC converter 18 is not included in the frequency band of the high-frequency signal that has been received by radio.

When the frequency band of the reception channel is, for example, 911.8 MHz to 912.2 MHz (that is, the center frequency is 912 MHz and the bandwidth is 400 KHz), that is, when the integral multiple of the frequency of the reference clock REFCLK (912 MHz (=48 MHz×19)) is included in the frequency band of the reception channel, as a matter of course, the integral multiple of the frequency of the frequency divided clock DCLK is included in the frequency band of the reception channel no matter by which frequency dividing ratio N (N is any integer) the frequency of the frequency divided clock DCLK is divided.

However, the radio communication device 2 is able to divide the frequency of the reference clock REFCLK by the frequency dividing ratio "N+M" of the fraction and to output the frequency divided clock DCLK. Therefore, the radio communication device 2 is able to perform control so that the integral multiple of the frequency of the frequency divided clock DCLK is not included in the frequency band of the high-frequency signal that has been received by radio. The radio communication device 2 is therefore able to suppress the increase in the power consumption without causing the reception sensitivity to be degraded.

Since the other configurations of the radio communication device 2 are similar to those of the radio communication device 1, descriptions thereof will be omitted.

As described above, the radio communication devices 1 and 2 according to the aforementioned first and second embodiments include the DCDC converter 18 as the voltage generator, whereby the radio communication devices 1 and 2 suppress the increase in the power consumption. The radio communication devices 1 and 2 according to the aforementioned first and second embodiments control the frequency dividing ratio of the variable frequency dividers 17 and 27 so that the integral multiple of the frequency of the frequency divided clock DCLK (high-frequency components) used for the switching operation of the DCDC converter 18 is not included in the frequency band of the reception channel. Accordingly, the radio communication devices 1 and 2 according to the aforementioned first and second embodiments are able to suppress the increase in the power consumption without causing the reception sensitivity to be degraded.

While the invention made by the present inventors has been specifically described based on the embodiments, it is needless to say that the present invention is not limited to the embodiments stated above and may be changed in various ways without departing from the spirit of the present invention.

For example, in the semiconductor device according to the above embodiments, the conductive type (p-type or n-type) of each of a semiconductor substrate, a semiconductor layer, a diffusion layer (diffusion region) may be inverted. Therefore, when one conductive type of the n type and the p type is a first conductive type and the other one of the n type and the p type is a second conductive type, the first conductive type may be the p type and the second conductive type may be the n type and vice versa.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A radio communication device comprising:
a variable frequency divider that divides a frequency of a reference clock and outputs a frequency divided clock;
a controller that controls a frequency dividing ratio of the variable frequency divider so that no integral multiple of a frequency of the frequency divided clock is included in a frequency band of a high-frequency signal that has been received from outside by radio; and
a DCDC converter that performs a switching operation in synchronization with the frequency divided clock to generate an output voltage obtained by stepping down an input voltage.

2. The radio communication device according to claim 1, wherein the controller controls the frequency dividing ratio of the variable frequency divider to N (N is an arbitrary natural number) so that no integral multiple of the frequency of the frequency divided clock is included in the frequency band of the high-frequency signal.

3. The radio communication device according to claim 1, wherein the controller controls the frequency dividing ratio of the variable frequency divider to N (N is an arbitrary natural number)+M (M is an arbitrary fraction) so that no integral multiple of the frequency of the frequency divided clock is included in the frequency band of the high-frequency signal.

4. The radio communication device according to claim 1, further comprising:
a PLL circuit that generates an output clock based on the reference clock; and
a mixer that performs a frequency conversion of the high-frequency signal based on the output clock;
wherein the controller acquires information on the frequency band of the high-frequency signal from the frequency of the output clock.

5. The radio communication device according to claim 1, wherein the reference clock is 48 MHz, the frequency dividing ratio is 13, the frequency band is 923.8 MHz to 924.2 MHz, and the frequency divided clock is 3.7 MHz.

6. A smart meter comprising:
an antenna that receives a high-frequency signal;
a variable frequency divider that divides a frequency of a reference clock and outputs a frequency divided clock;
a controller that controls a frequency dividing ratio of the variable frequency divider so that no integral multiple of a frequency of the frequency divided clock is included in a frequency band of the high-frequency signal that has been received by the antenna; and
a DCDC converter that performs a switching operation in synchronization with the frequency divided clock to generate an output voltage obtained by stepping down an input voltage.

7. A radio communication method comprising:
receiving a high-frequency signal by radio from outside via an antenna;
controlling a frequency dividing ratio of a variable frequency divider so that no integral multiple of a frequency of a frequency divided clock output from the variable frequency divider based on a reference clock is included in a frequency band of the high-frequency signal; and
performing a switching operation in synchronization with the frequency divided clock to output an output voltage obtained by stepping down an input voltage from a DCDC converter.

8. The radio communication method according to claim 7, wherein, in the step of controlling the frequency dividing ratio of the variable frequency divider, the frequency dividing ratio of the variable frequency divider is controlled to be N (N is an arbitrary natural number) so that no integral multiple of the frequency of the frequency divided clock is included in the frequency band of the high-frequency signal.

9. The radio communication method according to claim 7, wherein, in the step of controlling the frequency dividing ratio of the variable frequency divider, the frequency dividing ratio of the variable frequency divider is controlled to be N (N is an arbitrary natural number)+M (M is an arbitrary fraction) so that no integral multiple of the frequency of the frequency divided clock is included in the frequency band of the high-frequency signal.

10. The radio communication method according to claim 7, wherein the reference clock is 48 MHz, the frequency dividing ratio is 13, the frequency band is 923.8 MHz to 924.2 MHz, and the frequency divided clock is 3.7 MHz.

* * * * *